(12) United States Patent
Chen et al.

(10) Patent No.: US 11,791,434 B2
(45) Date of Patent: Oct. 17, 2023

(54) ELECTRONIC PACKAGE, OPTOELECTRONIC PACKAGE AND METHOD OF MANUFACTURING THE SAME

(71) Applicant: Advanced Semiconductor Engineering, Inc., Kaohsiung (TW)

(72) Inventors: Jun-Wei Chen, Kaohsiung (TW); Yu-Yuan Yeh, Kaohsiung (TW); Hsu-Nan Fang, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 36 days.

(21) Appl. No.: 17/522,823

(22) Filed: Nov. 9, 2021

(65) Prior Publication Data

US 2023/0144000 A1 May 11, 2023

(51) Int. Cl.
*H01L 31/12* (2006.01)
*H01L 31/02* (2006.01)

(52) U.S. Cl.
CPC ........ *H01L 31/12* (2013.01); *H01L 31/02005* (2013.01)

(58) Field of Classification Search
CPC .......................... H01L 31/12; H01L 31/02005
See application file for complete search history.

(56) References Cited

U.S. PATENT DOCUMENTS

| 10,643,937 | B2 | 5/2020 | Huang et al. | |
| 2007/0257335 | A1* | 11/2007 | O'Brien | H05K 1/183 257/E21.705 |
| 2010/0148293 | A1* | 6/2010 | Jain | A61B 5/0017 257/E21.135 |
| 2010/0327424 | A1* | 12/2010 | Braunisch | H01L 25/0655 257/692 |
| 2013/0213697 | A1* | 8/2013 | Palaniswamy | H01L 33/486 174/254 |
| 2017/0054062 | A1* | 2/2017 | Tamaki | H01L 33/507 |
| 2021/0126425 | A1 | 4/2021 | Lin et al. | |
| 2021/0375732 | A1* | 12/2021 | Thadesar | H01L 21/565 |

OTHER PUBLICATIONS

"Laser Diode Submounts (Au/Sn)", Applied Thin-Film Products, Nov. 9, 2021, https://www.thinfilm.com/submounts.html, 2 pages.

* cited by examiner

*Primary Examiner* — Sitaramarao S Yechuri
(74) *Attorney, Agent, or Firm* — FOLEY & LARDNER LLP

(57) ABSTRACT

An electronic package is provided. The electronic package includes a carrier, a first electronic component, a bonding element, and a barrier. The carrier has a conductive layer. The first electronic component is disposed adjacent to the carrier and has a first terminal and a second terminal. The bonding element is configured to electrically connect the conductive layer to the first terminal. The barrier is configured to avoid electrically bypassing an electrical path in the first electronic component and between the first terminal and the second terminal.

14 Claims, 15 Drawing Sheets

ELECTRONIC PACKAGE, OPTOELECTRONIC PACKAGE AND METHOD OF MANUFACTURING THE SAME

BACKGROUND

1. Technical Field

The present disclosure relates generally to an electronic package, an optoelectronic package and a method of manufacturing the same.

2. Description of the Related Art

Currently, an optoelectronic package may include a laser diode bonded to a photonic IC (PIC), and the laser diode may serve as a light source of the optoelectronic package. The laser diode is usually bonded to the PIC through a solder joint structure. The quality of the solder joint structure is crucial to the performance of the optoelectronic package. For example, the electrical connection between the laser diode and the PIC may be affected, and/or an undesired short circuit may occur.

SUMMARY

In one or more embodiments, an electronic package includes a carrier, a first electronic component, a bonding element, and a barrier. The carrier has a conductive layer. The first electronic component is disposed adjacent to the carrier and has a first terminal and a second terminal. The bonding element is configured to electrically connect the conductive layer to the first terminal. The barrier is configured to avoid electrically bypassing an electrical path in the first electronic component and between the first terminal and the second terminal.

In one or more embodiments, an electronic package includes a first electronic component, a carrier, an electrical bonding element, and a barrier. The carrier includes a conductive layer and defines a cavity accommodating the first electronic component. The carrier and the first electronic component collectively define a gap. The electrical bonding element is electrically connected to the conductive layer. The barrier is configured to block a passage by which the electrical bonding element contacts a surface of the first electronic component or enters the gap.

In one or more embodiments, an optoelectronic package includes a carrier, a light-emitting element, a substrate, and a barrier. The light-emitting element is disposed adjacent to the carrier. The substrate electrically connects the light-emitting element to the carrier via a bonding element. The barrier is disposed between the bonding element and the light-emitting element.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
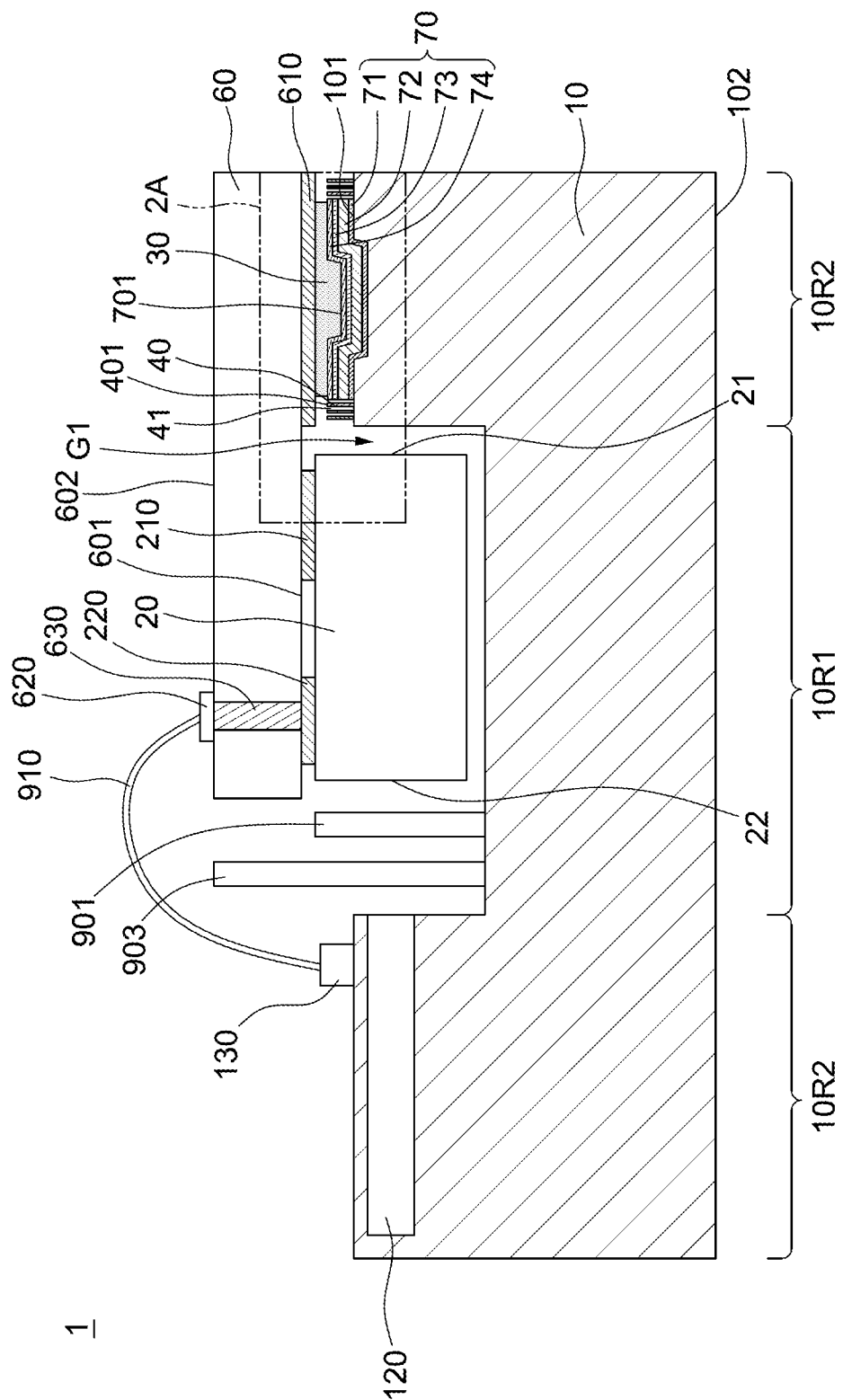
FIG. 1 illustrates a cross-sectional view of an electronic package in accordance with some embodiments of the present disclosure.

FIG. 1 illustrates a cross-sectional view of an electronic package 1 in accordance with some embodiments of the present disclosure. The electronic package 1 includes a carrier 10, an electronic component 20, a bonding element 30, a barrier 40, a substrate 60, a conductive element 70, a bonding wire 910, a lens 901, and a rotator 903. In some embodiments, the electronic package 1 may be or include an optoelectronic package.

The carrier 10 may include a region 10R1 and a region 10R2 adjacent to the region 10R1. The region 10R2 of the carrier 10 may be referred to as a predetermined region or a bonding region. In some embodiments, the carrier 10 defines a cavity accommodating the electronic component 20. In some embodiments, the region 10R1 of the carrier 10 may be or include a recessed portion (e.g., the cavity). The region 10R1 may be or include a recessed portion or a cavity exposed from a surface 101 (also referred to as "an upper surface") of the carrier 10.

The carrier 10 may be, for example, a printed circuit board, such as a paper-based copper foil laminate, a composite copper foil laminate, or a polymer-impregnated glass-fiber-based copper foil laminate. The carrier 10 may include a two-layer or multi-layer substrate which includes a core layer and a conductive material and/or structure disposed on an upper surface and a bottom surface of the carrier 10. In some embodiments, the carrier 10 may include a substrate, such as a semiconductor substrate, a ceramic substrate or an organic substrate. In some embodiments, the carrier 10 may include silicon (Si) and/or germanium (Ge) in a single crystal form, a polycrystalline form, or an amorphous form. In some embodiments, the carrier may include metal oxide, such as alumina. The carrier 10 may include an interconnection structure, such as a plurality of conductive traces and/or conductive through vias. In some embodiments, the carrier 10 includes a conductive layer (e.g., a conductive layer 110 illustrated in FIGS. 2A-2F). The carrier 10 may include one or more conductive pads (e.g., a conductive pad 130) in proximity to, adjacent to, or embedded in and exposed at the surface 101 of the carrier 10. The carrier 10 may include one or more conductive pads (not shown) in proximity to, adjacent to, or embedded in and exposed at a surface 102 (also referred to as "a bottom surface") of the carrier 10. The carrier 10 may include one or more components. In some embodiments, the carrier 10 may be or include a photonic component, such as a photonic integrated circuit (PIC), a photonic die, or a PIC wafer. In some embodiments, the carrier 10 further includes a waveguide 120 adjacent to the surface 101 of the carrier 10. In some embodiments, the waveguide 120 and the conductive pad 130 overlap from a top view perspective. In some embodiments, the waveguide 120 may be free from overlapping the conductive pad 130 from a top view perspective.

The electronic component 20 may be disposed over the region 10R1 of the carrier 10. In some embodiments, the electronic component 20 is disposed adjacent to the carrier 10 and includes terminals 210 and 220. In some embodiments, the terminal 210 and the terminal 220 collectively provides an electrical path configured to drive the electronic component 20. In some embodiments, the terminal 210 is more adjacent to the conductive layer (e.g., the conductive layer 110 illustrated in FIGS. 2A-2F) of the carrier 10 than the terminal 220 is. In some embodiments, the electronic component 20 is accommodated in the recessed portion or cavity (e.g., the region 10R1) of the carrier 10. In some embodiments, the carrier 10 and the electronic component 20 collectively define a gap G1. In some embodiments, the electronic component 20 includes a light-emitting element. In some embodiments, the light-emitting element includes one or more laser diodes, one or more LEDs, or a combination thereof.

The bonding element 30 may be disposed over the carrier 10. In some embodiments, the bonding element 30 is configured to electrically connect a conductive layer (e.g., a conductive layer 110 illustrated in FIGS. 2A-2F) of the carrier 10 to the terminal 210 of the electronic component 20. In some embodiments, the bonding element 30 is disposed over the region 10R2 of the carrier 10. In some embodiments, the bonding element 30 is spaced apart from the recessed portion (e.g., the region 10R1) of the carrier 10. In some embodiments, the electronic component 20 is spaced apart from the bonding element 30. In some embodiments, a lateral surface 21 of the electronic component 20 is spaced apart from the bonding element 30. In some embodiments, the electronic package 1 may include a plurality of bonding elements 30. In some embodiments, the electronic component 20 has a lateral surface 22 opposite to the lateral surface 21, and one of the bonding elements 30 is adjacent to and spaced apart from the lateral surface 22 of the electronic component 20. In some embodiments, the bonding element 30 includes an electrical bonding element. In some embodiments, the bonding element 30 includes gold (Au), silver (Ag), copper (Cu), nickel (Ni), a solder alloy, or a combination of two or more thereof. In some embodiments, the bonding element 30 includes a soldering material. For example, the bonding element 30 may be or include AuSn, CuSn, NiSn, or a combination of two or more thereof, but is not limited thereto.

The barrier 40 may be disposed over the region 10R2 of the carrier 10. In some embodiments, the barrier 40 is disposed over the region 10R2 of the carrier 10 and configured to prevent an overflow of the bonding element 30 from the region 10R2 of the carrier 10. In some embodiments, the barrier 40 is configured to prevent the bonding element 30 from contacting the electronic component 20. In some embodiments, the barrier 40 is disposed between the bonding element 30 and the carrier 10. In some embodiments, the barrier 40 physically or directly contacts the bonding element 30. In some embodiments, the electronic component 20 is spaced apart from the bonding element 30 by the barrier 40. In some embodiments, the barrier 40 includes one or more trenches 41 exposed from an upper surface 401 of the barrier 40. In some embodiments, the trenches 41 penetrate through the barrier 40. In some embodiments, each of the trenches 41 may have a strip shape, a cylinder shape, or an irregular shape, and in some embodiments, each of the trenches 41 may surround the periphery of the barrier 40 and has a ring shape from a top view perspective. In some embodiments, the barrier 40 includes a receiving space configured to accommodate an overflow of the bonding element 30. In some embodiments, the receiving space of the barrier 40 is configured to accommodate at least a portion of the bonding element 30. In some embodiments, the receiving space of the barrier 40 includes the trenches 41. In some embodiments, the barrier 40 includes the receiving space (e.g., the trenches 41) and is spaced apart from the conductive layer or pad of the carrier 10. In some embodiments, the barrier 40 is free from overlapping the recessed portion (e.g., the region 10R1) of the carrier 10. In some embodiments, the electronic package 1 may include a plurality of barriers 40. In some embodiments, one of the barriers 40 is adjacent to the lateral surface 21 of the electronic component 20. In some embodiments, the barriers 40 surround the recessed portion (e.g., the region 10R1) of the carrier 10. In some embodiments, the barrier 40 may be or include a semiconductive material (such Si), a metal (such as Au, Ag, Cu, aluminum (Al)) or an alloy thereof, but is not limited thereto. In some embodiments, the barrier 40 may be or include Al. In some other embodiments, the barrier 40 include be or include an insulating material.

In some embodiments, the barrier 40 is configured to avoid electrically bypassing an electrical path in the electronic component 20 and between the terminal 210 and the terminal 220. In some embodiments, the barrier 40 is configured to block a passage which is configured to electrically bypass an electrical path in the electronic component 20 and between the terminal 210 and the terminal 220. For example, when the electrical path in the electronic component 20 and between the terminals 210 and 220 is electrically bypassed through the passage, the performance of the electronic component 20 may be deteriorated or an electrical short may occur. The barrier 40 is configured to block the aforesaid passage and thus can ensure that the electrical path drives the electronic component 20. In some embodiments, the barrier 40 is configured to block a passage by which the bonding element 30 contacts a surface (e.g., the surface 21) of the electronic component 20 or enters the gap G1. In some embodiments, the passage includes the gap G1 between the electronic component 20 and the carrier 10. The aforesaid passage may be formed by an overflow of the bonding element 30. In some embodiments, when an overflow of the bonding element 30 extends towards the electronic component 20, the overflow of the bonding element 30 may extend into the gap G1 and contact the electronic component 20 such that an electrical short between the bonding element 30 and the terminal 210 or 220 is formed. As a result, the electrical path provided by the two terminals 210 and 220 and configured to drive the electronic component 20 may fail or be adversely affected due to the current leakage from the passage, which results in failing or malfunction of the electronic package 1. According to some embodiments of the present disclosure, with the design of the barrier 40, the formation of the aforesaid electric short can be alleviated or prevented.

The conductive element 70 may be disposed between the carrier 10 and the bonding element 30. In some embodiments, the conductive element 70 contacts a conductive layer or pad (not shown in FIG. 1) of the carrier 10. In some embodiments, the conductive element 70 includes a recessed surface 701 facing the bonding element 30. The recessed surface 701 defines a cavity which may be configured to accommodate an excess amount of the bonding element 30 to mitigate or prevent an overflow of the bonding element 30. In some embodiments, the conductive element 70 may be or include Au, Ag, Cu, aluminum (Al), or an alloy thereof, but is not limited thereto. In some embodiments, the conductive element 70 is or includes an under bump metallurgy layer (UBM layer). In some embodiments, the conductive element 70 includes a UBM seed layer 71 and one or more conductive layers, such as a copper layer 72, a nickel layer 73 and a gold layer 74, sequentially disposed on the carrier 10.

The substrate 60 may be connected to the electronic component 20. In some embodiments, the substrate 60 may be, for example, a printed circuit board, such as a paper-based copper foil laminate, a composite copper foil laminate, or a polymer-impregnated glass-fiber-based copper foil laminate. In some embodiments, the substrate 60 may be or include a semiconductor substrate, a ceramic substrate or an organic substrate. In some embodiments, the substrate 60 may include oxide (such as alumina or beryllium oxide) or nitride (such as aluminum nitride). In some embodiments, the substrate 60 may be a single-layer substrate, a two-layer substrate or a multi-layer substrate. The substrate 60 may include an interconnection structure, such as a plurality of conductive traces and/or conductive through vias. The substrate 60 may include a conductive layer 610 in proximity to, adjacent to, or embedded in and exposed at a surface 601 of the substrate 60. In some embodiments, the substrate 60 is electrically connected to the bonding element 30 through the conductive layer 610. In some embodiments, the substrate 60 electrically connects the electronic component 20 to the carrier 10 at least via the bonding element 30. In some embodiments, the substrate 60 includes a conductive pad 620 on a surface 602 opposite to the surface 601, and a conductive through via 630 passing the substrate 60. In some embodiments, the conductive through via 630 electrically connects the conductive pad 620 and the terminal 220.

The terminals 210 and 220 may be between the electronic component 20 and the substrate 60. In some embodiments, the terminals 210 and 220 are electrically connected to two electrodes of the electronic component 20, respectively. In some embodiments, the electronic component 20 is electrically connected to the carrier 10 through the terminal 210, the substrate 60, the bonding element 30, and the conductive element 70. The terminals 210 and 220 may include conductive pads, conductive pillars, conductive studs, or a combination thereof.

The bonding wire 910 may electrically connect the substrate 60 to the carrier 10. In some embodiments, the bonding wire 910 electrically connects the conductive pad 620 of the substrate 60 to the conductive pad 130 of the carrier 10.

In some cases where a conventional UBM layer is provided for a solder-joint operation, the solder on the UBM layer may melt and flow over the UBM layer to touch an adjacent electronic component, resulting in undesired short circuit issues. For example, when a light-emitting element (e.g., a laser diode) is mounted on a carrier or substrate which is bonded to another carrier or substrate (e.g., a PIC) through a solder, the solder may be melted on an UBM layer of the PIC during the bonding operation, and the molten solder may overflow and touch or contact the laser diode. In contrast, according to some embodiments of the present disclosure, the barrier 40 disposed over the bonding region (e.g., the region 10R2) of the carrier 10 can accommodate the overflow of the bonding element 30 when melted, and thus the bonding element 30 can be prevented from overflowing from the bonding region toward the electronic component 20. Therefore, the electronic component 20 can be free from contacting the overflow of the bonding element 30, and thus an undesired short circuit can be prevented.

In addition, according to some embodiments of the present disclosure, the bonding element 30 includes a soldering material, and the barrier 40 includes one or more trenches 41 to accommodate the excess molten soldering material of the bonding element 30. Therefore, the overflow of the molten soldering material can be confined within the trenches 41, and thus the electronic component 20 can be free from contacting the overflow of the bonding element 30.

Figure 1A:
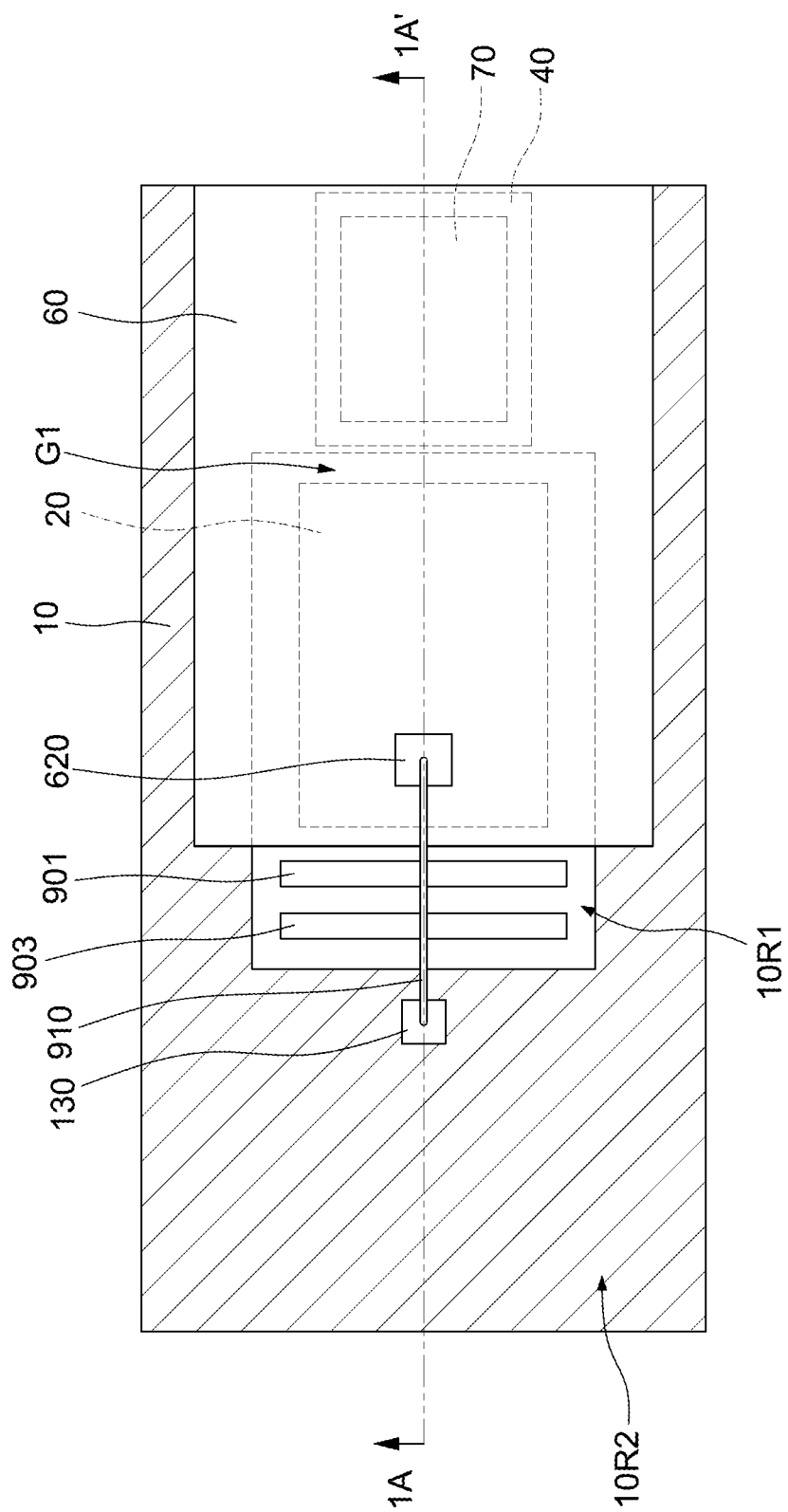
FIG. 1A illustrates a top view of an electronic package in accordance with some embodiments of the present disclosure.

FIG. 1A illustrates a top view of an electronic component 1 in accordance with some embodiments of the present disclosure. In some embodiments, FIG. 1 illustrates a cross-sectional view along the cross-sectional line 1A-1A' in FIG. 1A.

In some embodiments, the substrate 60 may be disposed on the carrier 10. In some embodiments, the substrate 60 covers at least a portion of the cavity (e.g., the region 10R1) of the carrier 10.

Figure 1B:
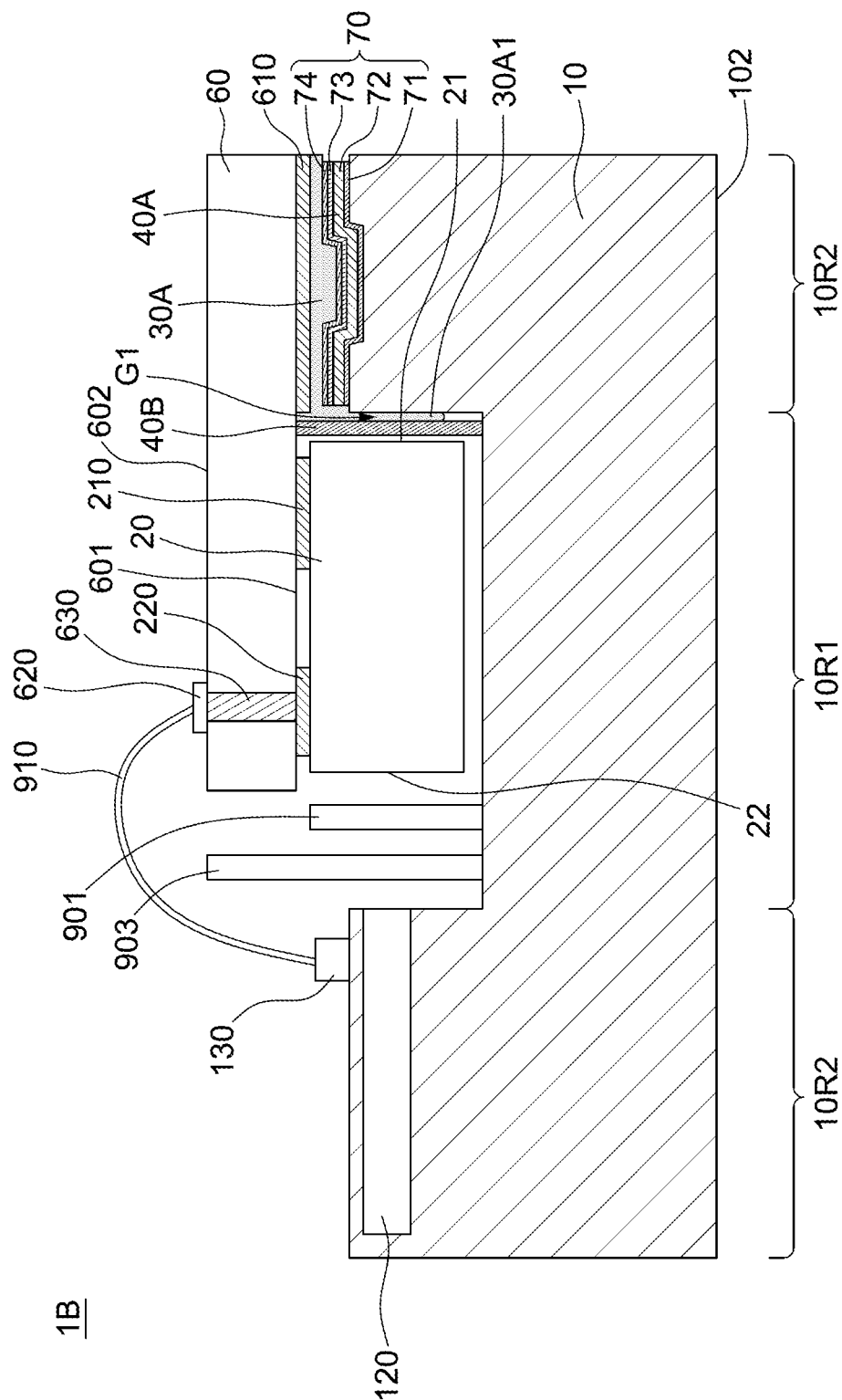
FIG. 1B illustrates a cross-sectional view of an electronic package in accordance with some embodiments of the present disclosure.

FIG. 1B illustrates a cross-sectional view of an electronic package 1B in accordance with some embodiments of the present disclosure. The electronic package 1B is similar to the electronic package 1 in FIG. 1, and the differences therebetween are described as follows.

In some embodiments, the electronic package 1B may include a barrier 40B. In some embodiments, the barrier 40B physically or directly contacts the bonding element 30. In some embodiments, the electronic component 20 is spaced apart from the bonding element 30 by the barrier 40B. In some embodiments, the barrier 40B physically or directly contacts the substrate 60. In some embodiments, the barrier 40B is located within the recessed portion or cavity (e.g., the region 10R1) of the carrier 10. In some embodiments, the barrier 40B is in the gap G1 between the electronic component 20 and a sidewall of the portion 10R1 (or the recessed portion) of the carrier 10. In some embodiments, the barrier 40B may be or include an insulating material. In some embodiments, the barrier 40B may physically or directly contact the electronic component 20.

In some embodiments, the barrier 40B may include an insulation wall structure. In some embodiments, the electronic package 1B may include two or more barriers 40B adjacent to the lateral surfaces (e.g., 21 and 22) of the electronic component 20, respectively. In some embodiments, the electronic package 1B may include one or more barriers 40B and free of the barrier 40.

Figure 2A:
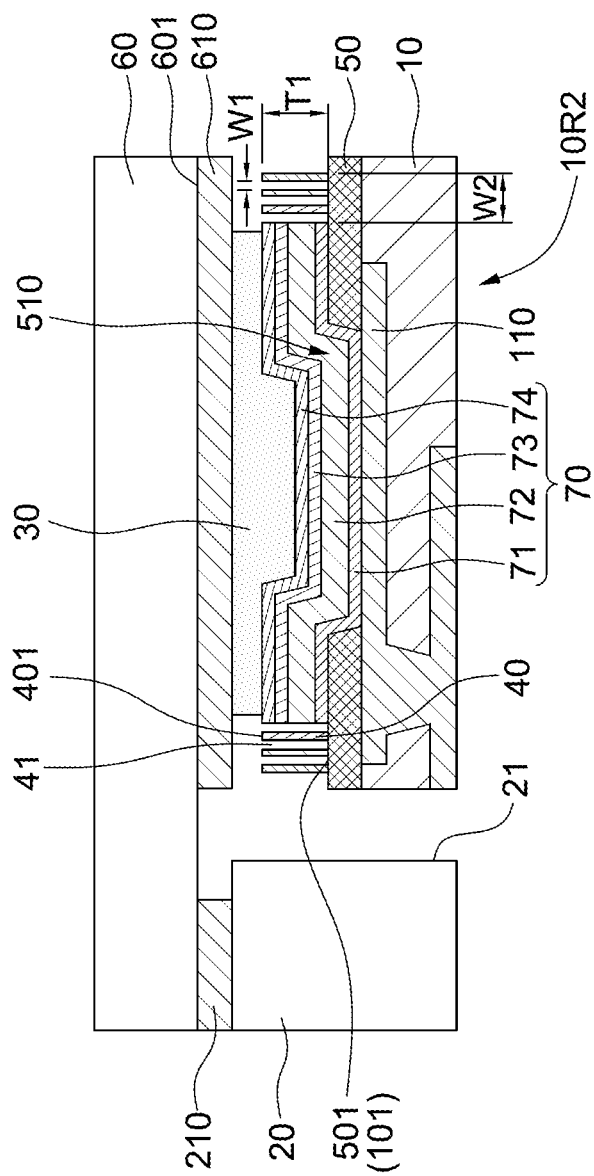
FIG. 2A illustrates a cross-sectional view of a portion of an electronic package in accordance with some embodiments of the present disclosure.

FIG. 2A illustrates a cross-sectional view of a portion of an electronic package 1 in accordance with some embodiments of the present disclosure. In some embodiments, FIG. 2A illustrates a cross-sectional view of the structure in the dashed box 2A in FIG. 1.

In some embodiments, the region 10R2 of the carrier 10 includes a conductive layer 110 (or a conductive pad) in proximity to, adjacent to, or embedded in and exposed at the surface 101 of the carrier 10. In some embodiments, the conductive element 70 is electrically connected to the conductive layer 110 of the carrier 10. In some embodiments, the conductive element 70 physically or directly contacts the conductive layer 110 of the carrier 10. In some embodiments, the receiving space (e.g., the trenches 41) of the barrier 40 is spaced apart from the conductive layer 110 of the carrier 10.

In some embodiments, the electronic package 1 further includes a dielectric layer 50. In some embodiments, the conductive layer 110 of the carrier 10 is disposed under the dielectric layer 50. In some embodiments, the dielectric layer 50 is between the carrier 10 and the barrier 40. In some embodiments, the dielectric layer 50 is between the conductive layer 110 of the carrier 10 and the barrier 40. In some embodiments, the conductive element 70 extends through an opening 510 of the dielectric layer 50 to electrically connect to the conductive layer 110 of the carrier 10.

In some embodiments, a portion of an upper surface 501 of the dielectric layer 50 is exposed from the trenches 41 (or the through trenches) which passes through the barrier 40. In some embodiments, the upper surface 501 may be viewed as the surface 101 (or the upper surface) of the carrier 10. In some embodiments, the barrier 40 overlaps the dielectric layer 50. In some embodiments, the trenches 41 of the barrier 40 overlap the dielectric layer 50. In some embodiments, the bonding element 30 is free from overlapping the trenches 41. In some embodiments, a depth T1 of the trenches 41 is from about 1 μm to about 1.5 μm, or about 1.2 μm. In some embodiments, a width W1 of the trenches 41 is from about 10 μm to about 50 μm. In some embodiments, a width W2 of the barrier 40 (e.g., the portion including the trenches 41) is from about 120 μm to about 180 μm, or about 150 μm.

Figure 2B:
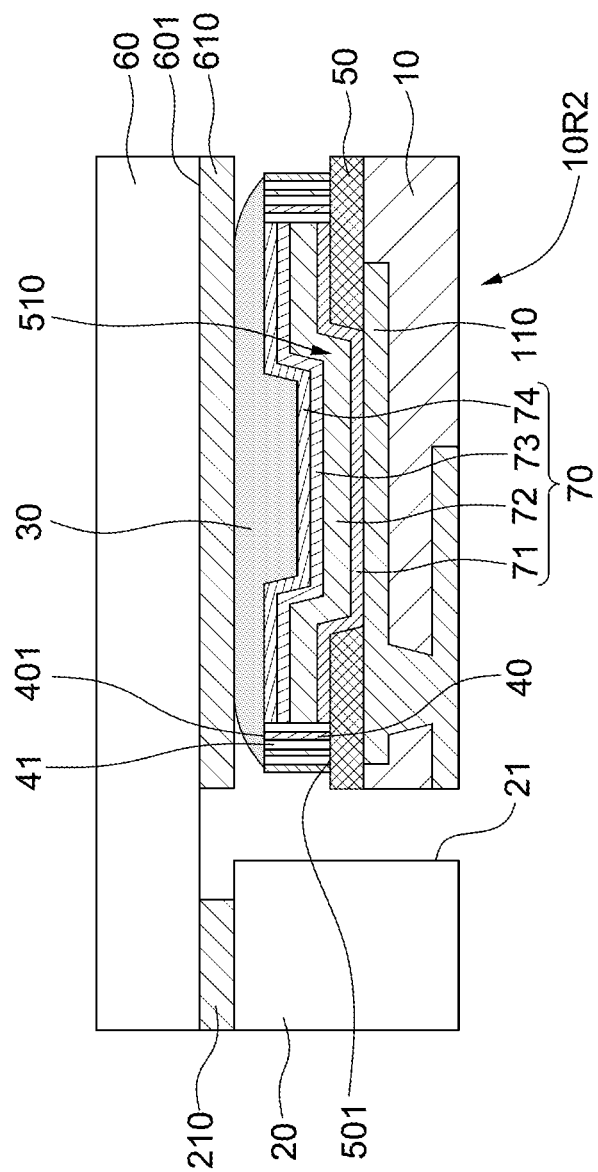
FIG. 2B illustrates a cross-sectional view of a portion of an electronic package in accordance with some embodiments of the present disclosure.

FIG. 2B illustrates a cross-sectional view of a portion of an electronic package 1 in accordance with some embodiments of the present disclosure. In some embodiments, FIG. 2B illustrates a cross-sectional view of the structure in the dashed box 2A in FIG. 1.

In some embodiments, the bonding element 30 extends on the receiving space (e.g., the trenches 41) of the barrier 40.

Figure 2C:
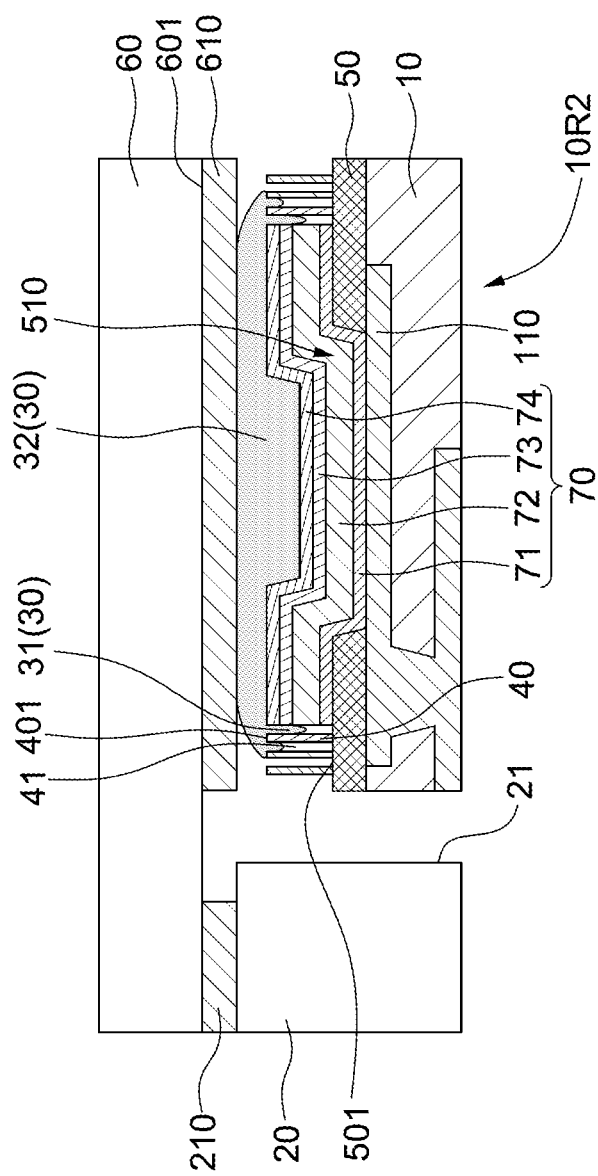
FIG. 2C illustrates a cross-sectional view of a portion of an electronic package in accordance with some embodiments of the present disclosure.

FIG. 2C illustrates a cross-sectional view of a portion of an electronic package 1 in accordance with some embodiments of the present disclosure. In some embodiments, FIG. 2C illustrates a cross-sectional view of the structure in the dashed box 2A in FIG. 1.

In some embodiments, the bonding element 30 includes portions 31 and 32. In some embodiments, the portion 31 of the bonding element 30 is on the barrier 40, and the portion 32 of the bonding element 30 is on the conductive element 70. In some embodiments, the portion 31 of the bonding element 30 extends into the receiving space of the barrier 40. In some embodiments, the portion 31 of the bonding element 30 partially fills the receiving space of the barrier 40. In some embodiments, the portion 31 of the bonding element 30 is within at least one of the trenches 41 of the barrier 40. In some embodiments, the portion 31 of the bonding element 30 contacts a sidewall of the trench 41 which passes through the barrier 40. In some embodiments, the portion 32 of the bonding element 30 is outside of the trenches 41 of the barrier 40.

In some embodiments, the portion 31 is in the upper portions of the trenches 41 and spaced apart from the bottom surfaces of the trenches 41. The portion 31 in the upper portions of the trenches 41 may be formed from an overflow of the bonding element 30 when melted in a bonding operation. In some embodiments, the portion 31 in the upper portions of the trenches 41 may be or include Au, Ag, Cu, Ni, AuSn, CuSn, NiSn, or a combination of two or more thereof, but is not limited thereto. In some embodiments, the portion 32 of bonding element 30 may be or include Au, Ag, Cu, Ni, AuSn, CuSn, NiSn, or a combination of two or more thereof, but is not limited thereto. In some embodiments, the portion 31 and the portion 32 of the bonding element 30 may be made of the same material, for example, a solder alloy, such as AuSn, CuSn, NiSn.

Figure 2D:
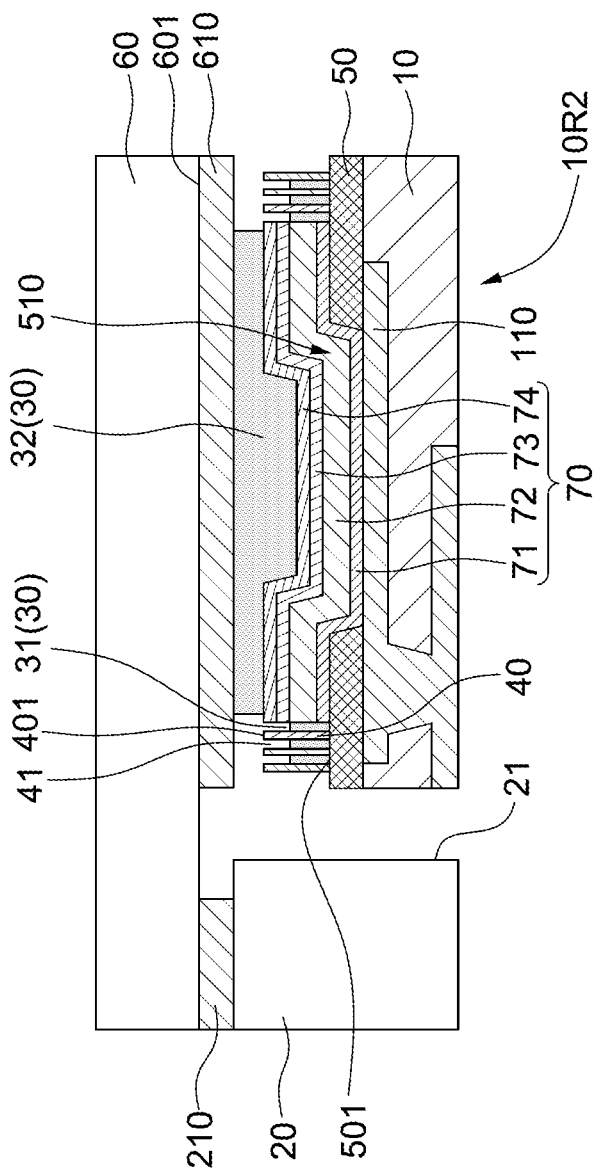
FIG. 2D illustrates a cross-sectional view of a portion of an electronic package in accordance with some embodiments of the present disclosure.

FIG. 2D illustrates a cross-sectional view of a portion of an electronic package 1 in accordance with some embodiments of the present disclosure. In some embodiments, FIG. 2D illustrates a cross-sectional view of the structure in the dashed box 2A in FIG. 1.

In some embodiments, the portion 31 of the bonding element 30 contacts a sidewall of the trench 41 (which passes through the barrier 40) and a portion of the dielectric layer 50. In some embodiments, the portion 31 of the bonding element 30 physically or directly contacts a portion of the upper surface 501 of the dielectric layer 50. In some embodiments, the portion 31 is separated or spaced apart from the portion 32 of the bonding element 30.

In some embodiments, the portion 31 is in the bottom portions of the trenches 41 and spaced apart from the portion 32 of the bonding element 30. The portion 31 and the portion 32 of the bonding element 30 may be formed in separate operations. The portion 31 may be formed by filling a bonding material, e.g., by deposition, in the trenches 41 prior to a bonding operation between the bonding element 30 and the substrate 60. In some embodiments, the portion 31 may be formed conformally. In some embodiments, the portion 31 in the bottom portions of the trenches 41 may be or include Au, Ag, Cu, Ni, or a combination of two or more thereof, but is not limited thereto. In some embodiments, the portion 32 of bonding element 30 may be or include Au, Ag, Cu, Ni, AuSn, CuSn, NiSn, or a combination of two or more thereof, but is not limited thereto.

Figure 2E:
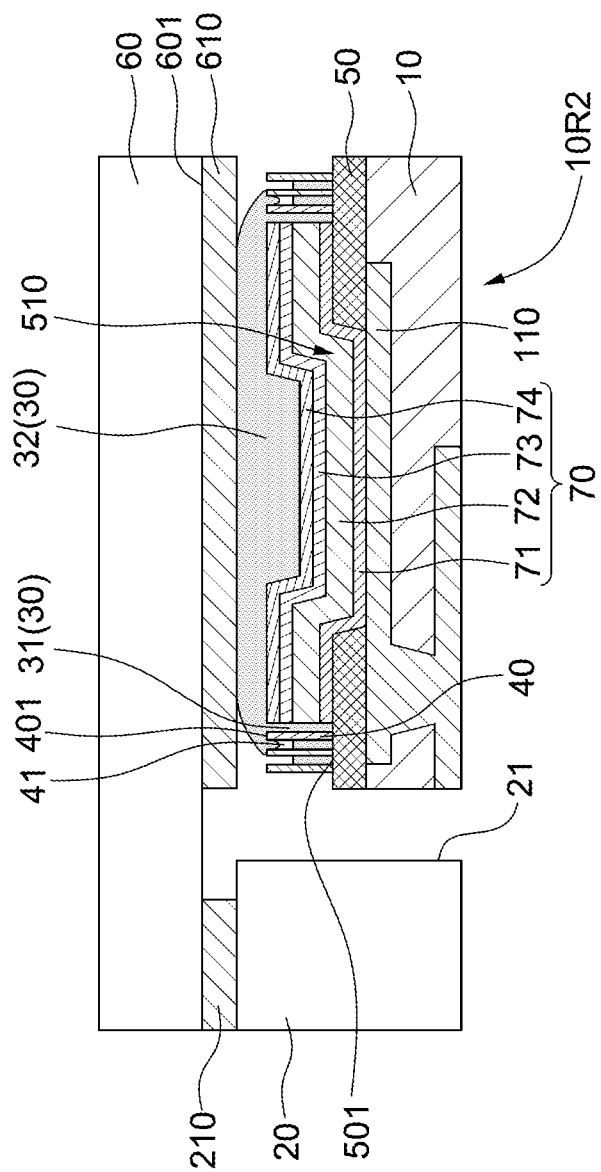
FIG. 2E illustrates a cross-sectional view of a portion of an electronic package in accordance with some embodiments of the present disclosure.

FIG. 2E illustrates a cross-sectional view of a portion of an electronic package 1 in accordance with some embodiments of the present disclosure. In some embodiments, FIG. 2E illustrates a cross-sectional view of the structure in the dashed box 2A in FIG. 1.

In some embodiments, the portion 31 of the bonding element 30 partially fills the trenches 41. In some embodiments, the portion 31 of the bonding element 30 extends into at least one of the trenches 41 from the upper surface 401 of the barrier 40 and contacts a portion of the dielectric layer 50.

In some embodiments, the portion 31 may include a bonding material filled in the trenches 41 prior to a bonding operation between the bonding element 30 and the substrate 60, an overflow of the bonding element 30 which is melted and flows into the trenches 41 during a bonding operation, and/or an intermetallic material which is a reaction product of the overflow of the bonding element 30 and the bonding material filled in the trenches 41. The species of the bonding material filled in the trenches 41 and the species of the material of the bonding element 30 are as discussed above. In some embodiments, the bonding material is filled in the trenches 41, e.g., by deposition, prior to a bonding operation between the bonding element 30 and the substrate 60, and can be formed conformally in the trenches 41. In some embodiments, the portion 31 may be or include Au, Ag, Cu, Ni, AuSn, CuSn, NiSn, $Au_5Sn$, $Cu_6Sn_5$ or $Ni_3Sn_4$, or a combination of two or more thereof, but is not limited thereto. In some embodiments, the portion 32 of bonding element 30 may be or include Au, Ag, Cu, Ni, AuSn, CuSn, NiSn, or a combination of two or more thereof, but is not limited thereto. In some embodiments, the portion 31 of the bonding element 30 includes an intermetallic material (e.g., $Au_5Sn$), and the portion 32 of the bonding element 30 includes a solder alloy (e.g., AuSn). In some embodiments, a hardness of the portion 31 is different from a hardness of the portion 32. In some embodiments, a hardness of the portion 31 is greater than a hardness of the portion 32.

Figure 2F:
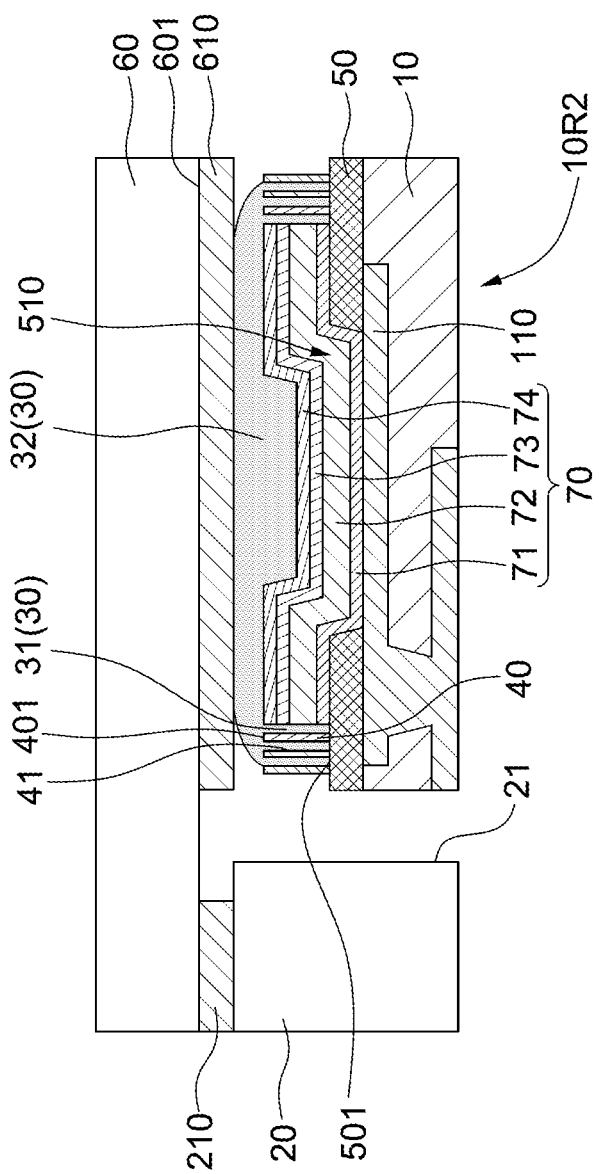
FIG. 2F illustrates a cross-sectional view of a portion of an electronic package in accordance with some embodiments of the present disclosure.

FIG. 2F illustrates a cross-sectional view of a portion of an electronic package 1 in accordance with some embodiments of the present disclosure. In some embodiments, FIG. 2F illustrates a cross-sectional view of the structure in the dashed box 2A in FIG. 1.

In some embodiments, the portion 31 of the bonding element 30 fills in the trenches 41 of the barrier 40. In some embodiments, the portion 31 of the bonding element 30 may include an intermetallic material. In some embodiments, the intermetallic material is formed from an overflow of the bonding element 30 (which is melted and flows into the trenches 41) and a bonding material (which is formed, for example, conformally on the sidewall and the bottom surface of the trenches 41, prior to a bonding operation between the bonding element 30 and the substrate 60). In some embodiments, the portion 31 of the bonding element 30 includes $Au_5Sn$, $Cu_6Sn_5$ or $Ni_3Sn_4$, but is not limited thereto. In some embodiments, the portion 32 of bonding element 30 may be or include Au, Ag, Cu, Ni, AuSn, CuSn, NiSn, or a combination of two or more thereof, but is not limited thereto. In some embodiments, the portion 31 of the bonding element 30 includes $Au_5Sn$, and the portion 32 of the bonding element 30 includes AuSn. In some embodiments, a hardness of the portion 31 is different from a hardness of the portion 32. In some embodiments, a hardness of the portion 31 is greater than a hardness of the portion 32.

According to some embodiments of the present disclosure, the portion 31 of the bonding element 30 within the trenches 41 may be or include an intermetallic material. Therefore, the portion 31 of the bonding element 30 has a relatively greater hardness compared to that of a soldering material, and thus the portion 31 of the bonding element 30 can increase the bonding strength between the bonding element 30 and the barrier 40.

Figure 3A:
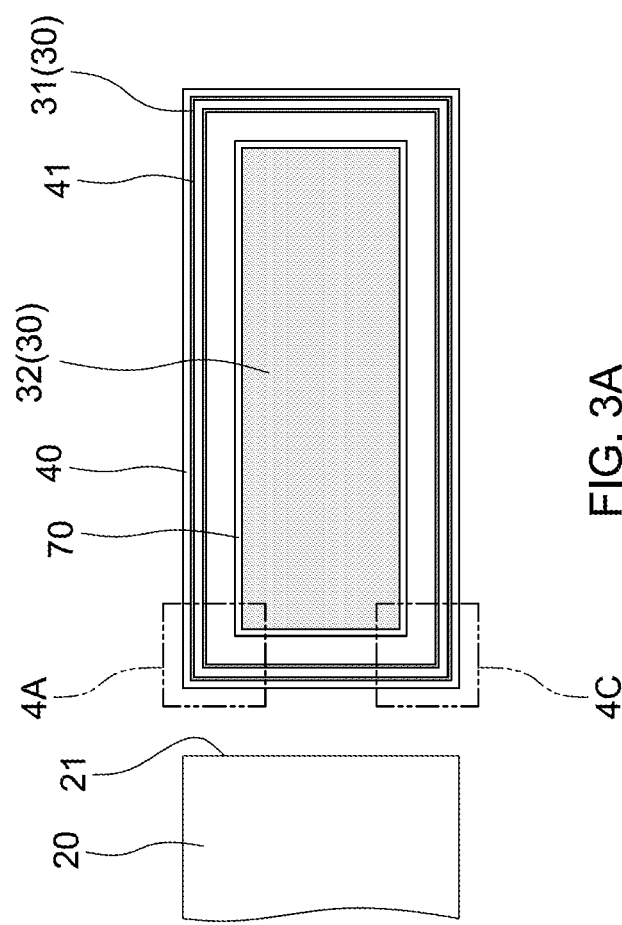
FIG. 3A illustrates a top view of a portion of an electronic package in accordance with some embodiments of the present disclosure.

FIG. 3A illustrates a top view of a portion of an electronic package 1 in accordance with some embodiments of the present disclosure. In some embodiments, FIG. 3A illustrate a top view of the bonding element 30, the barrier 40, and a portion of the electronic component 20 of the electronic package 1. It should be noted that some components are omitted in FIG. 3A for clarity.

In some embodiments, the trenches 41 surround the conductive element 70. In some embodiments, the trenches 41 may have a ring shape from a top view. In some embodiments, the trenches 41 are separated from each other. In some embodiments, the portion 31 of the bonding element 30 is filled in the trenches 41 of the barrier 40. In some embodiments, the bonding element 30 is spaced apart from the lateral surface 21 of the electronic component 20.

Figure 3B:
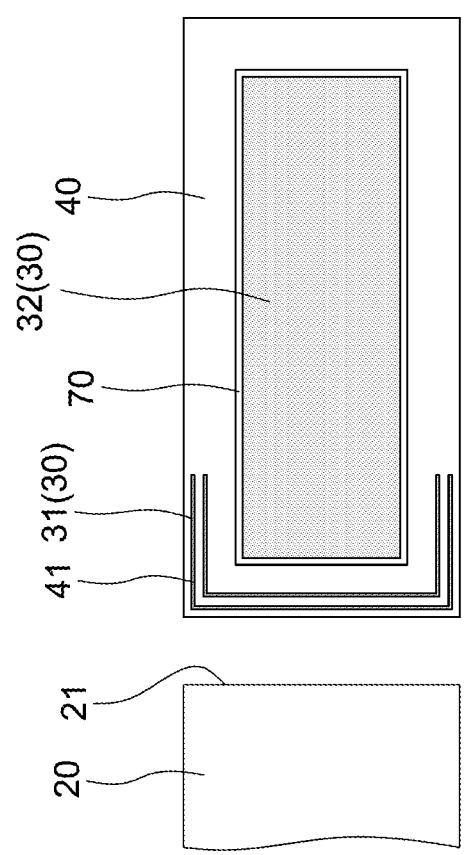
FIG. 3B illustrates a top view of a portion of an electronic package in accordance with some embodiments of the present disclosure.

FIG. 3B illustrates a top view of a portion of an electronic package 1 in accordance with some embodiments of the present disclosure. In some embodiments, FIG. 3B illustrate a top view of the bonding element 30, the barrier 40, and a portion of the electronic component 20 of the electronic package 1. It should be noted that some components are omitted in FIG. 3B for clarity.

In some embodiments, the trenches 41 are located at a region of the barrier 40 adjacent to the electronic component 20. Therefore, the trenches 41 can accommodate the overflow of the bonding element 30 when melted, and thus the bonding element 30 can be prevented from overflowing from the bonding region (e.g., the region corresponding to the portion 32 of the bonding element 30) toward the electronic component 20. In addition, the overflow of the bonding element 30 can react with the bonding material filled in the trenches 41 in advance to form an intermetallic material, which forms the portion 31 of the bonding element 30, and thus the bonding strength can be increased. In some embodiments, a region of the barrier 40 distal from the electronic component 20 may be free of trenches 41.

Figure 3C:
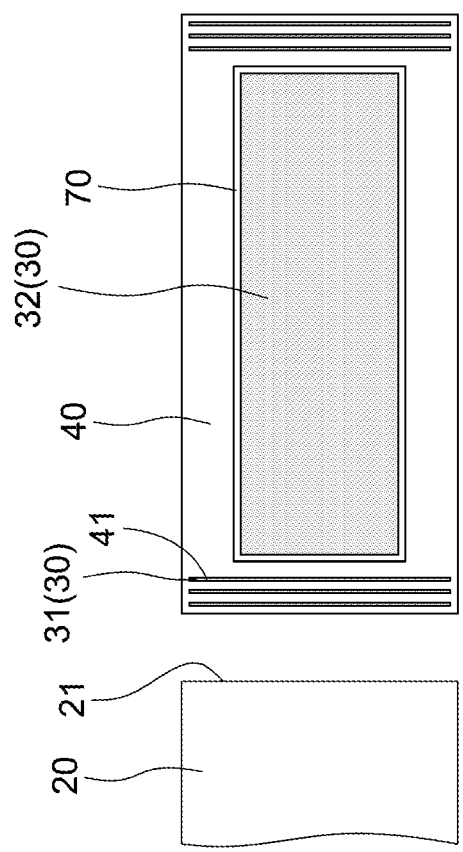
FIG. 3C illustrates a top view of a portion of an electronic package in accordance with some embodiments of the present disclosure.

FIG. 3C illustrates a top view of a portion of an electronic package 1 in accordance with some embodiments of the present disclosure. In some embodiments, FIG. 3C illustrate a top view of the bonding element 30, the barrier 40, and a portion of the electronic component 20 of the electronic package 1. It should be noted that some components are omitted in FIG. 3C for clarity.

In some embodiments, the trenches 41 are located at a plurality of regions of the barrier 40. There regions of trenches 41 may be separated from each other. For example, two regions of trenches 41 are located at opposite sides of the central region of the barrier 40. In some embodiments, a region of trenches 41 is adjacent to the lateral surface 21 of the electronic component 20.

Figure 4B:
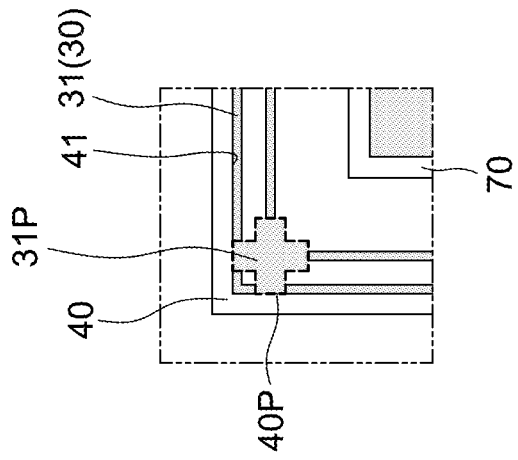
FIG. 4B illustrates a top view of a portion of an electronic package in accordance with some embodiments of the present disclosure.
Figure 4A:
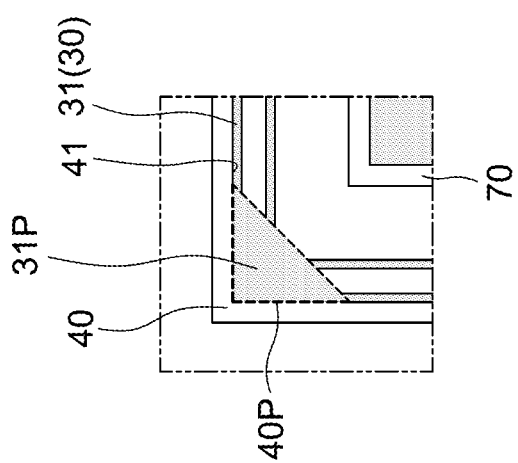
FIG. 4A illustrates a top view of a portion of an electronic package in accordance with some embodiments of the present disclosure.

FIG. 4A illustrates a top view of a portion of an electronic package 1 in accordance with some embodiments of the present disclosure. In some embodiments, FIG. 4A illustrate a top view of the structure in the dashed box 4A in FIG. 3A.

In some embodiments, at least one of the trenches 41 includes a patterned portion 40P (or a predetermined pattern). In some embodiments as illustrated in FIG. 4A, the patterned portion 40P connects at least two of the trenches 41. In some embodiments, the portion 31 of the bonding element 30 at least partially fills in the patterned portion 40P of the trenches 41. In some embodiments, the portion 31 of the bonding element 30 includes a pattern 31P. In some embodiments, the pattern 31P of the portion 31 of the bonding element 30 is conformal with the predetermined pattern 40P of the trenches 41. For example, a cross-sectional profile of the patterned portion 40P is conformal with a cross-sectional profile of the pattern 31P. In some embodiments, a size (e.g., width) of the patterned portion 40P is greater than a size (e.g., width) of the trenches 41. The patterned portion 40P has an enlarged volume and can accommodate a greater volume of the overflow of the bonding element 30. In some embodiments, the patterned portion 40P can serve as an alignment mark in a bonding operation.

Figure 4C:
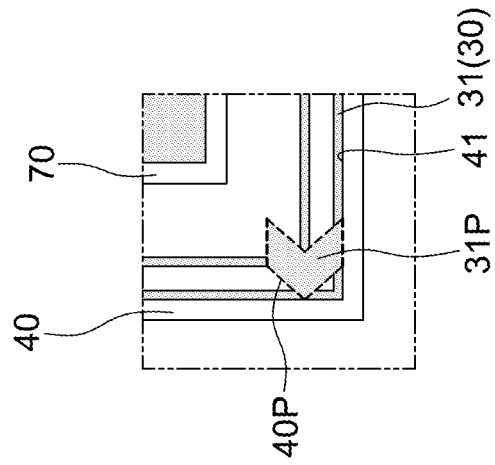
FIG. 4C illustrates a top view of a portion of an electronic package in accordance with some embodiments of the present disclosure.
Figure 4D:
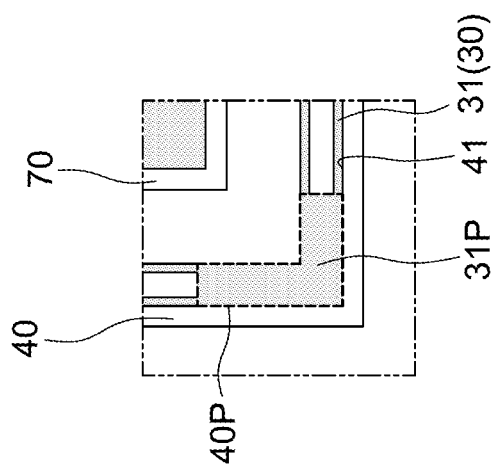
FIG. 4D illustrates a top view of a portion of an electronic package in accordance with some embodiments of the present disclosure.

FIG. 4B illustrates a top view of a portion of an electronic package 1 in accordance with some embodiments of the present disclosure. In some embodiments, FIG. 4B illustrate a top view of the structure in the dashed box 4A in FIG. 3A. FIG. 4C illustrates a top view of a portion of an electronic package 1 in accordance with some embodiments of the present disclosure. In some embodiments, FIG. 4C illustrate a top view of the structure in the dashed box 4C in FIG. 3A. FIG. 4D illustrates a top view of a portion of an electronic package 1 in accordance with some embodiments of the present disclosure In some embodiments, FIG. 4D illustrate a top view of the structure in the dashed box 4C in FIG. 3A.

In some embodiments, the patterned portion 40P may have various shapes or profiles according to actual applications. For example, different shapes or profiles may provide different marking functions, for example, different alignment marks may correspond to different alignment positions. The patterned portions 40P illustrated in FIGS. 4A and 4B can be manufactured on the position in the dashed box 4C in FIG. 3A, and the patterned portions 40P illustrated in FIGS. 4C and 4D can be manufactured on the position in the dashed box 4A in FIG. 3A.

FIG. 5A, FIG. 5B, FIG. 5C, FIG. 5D, FIG. 5E, and FIG. 5F illustrate various operations in a method of manufacturing an electronic package 1 in accordance with some embodiments of the present disclosure. For simplification, FIG. 5A, FIG. 5B, FIG. 5C, FIG. 5D, FIG. 5E, and FIG. 5F illustrate only a portion of an electronic package 1 during different operation stages and relate to the formation of the bonding element 30 and the barrier 40. The drawings, such as FIGS. 1 and 2D, mentioned hereinbefore may be referred to when describing specific elements.

Referring to FIG. 1, a carrier 10 including regions 10R1 and 10R2, a substrate 60 and an electronic component 20 may be provided. The electronic component 20 may be attached to a surface 601 of the substrate 60.

Figure 5A:
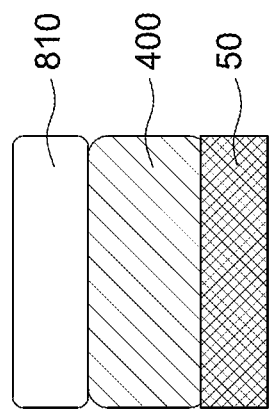
FIG. 5A, FIG. 5B, FIG. 5C, FIG. 5D, FIG. 5E, and FIG. 5F illustrate various operations in a method of manufacturing an electronic package in accordance with some embodiments of the present disclosure.

Referring to FIGS. 2D and 5A, a dielectric layer 50 may be formed on an upper surface of the carrier 10 at the region 10R2, a barrier material 400 may be formed on the dielectric layer 50, and a photoresist 810 may be formed on the barrier material 400. The photoresist 810 may be formed by spin coating.

Figure 5B:
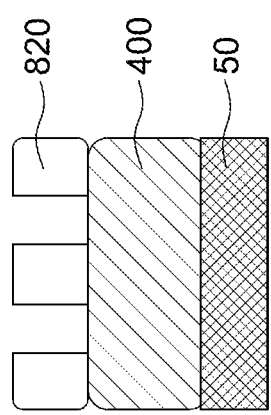

Referring to FIGS. 2D and 5B, a patterning operation may be performed on the photoresist 810 to form a patterned photoresist 820 on the barrier material 400. The patterning operation may be performed by lithographic technique.

Figure 5C:
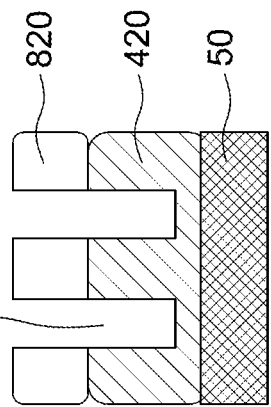

Referring to FIGS. 2D and 5C, portions of the barrier material 400 may be removed to form trenches 41 so as to form a barrier 40 over the region 10R2 of the carrier 10. In some embodiments, the trenches 41 may be formed by performing an etching operation on the barrier material 400 according to the patterned photoresist 820. In some embodiments, bottoms of the trenches 41 are spaced apart from the dielectric layer 50. In some other embodiments, the trenches 41 may penetrate through the barrier 40 and expose the dielectric layer 50.

Figure 5D:
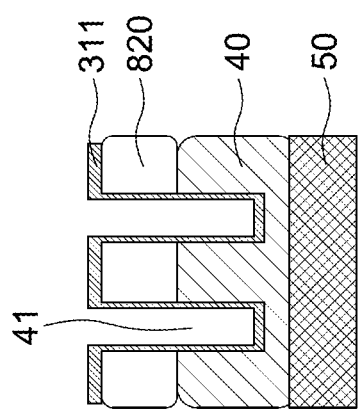

Referring to FIGS. 2D and 5D, a seed layer 311 may be formed in the trenches 41 and covering sidewalls and bottom surfaces of the trenches 41. In some embodiments, the seed layer 311 is formed on top surfaces and sidewalls of the patterned photoresist 820. The seed layer 311 may be formed by PVD.

Figure 5E:
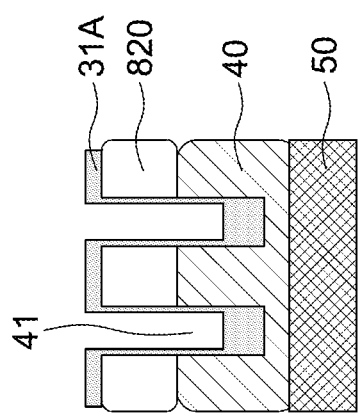

Referring to FIGS. 2D and 5E, a bonding material 31A may be formed in the trenches 41 and covering sidewalls and bottom surfaces of the trenches 41. In some embodiments, the bonding material 31A is formed on the seed layer 311 (not shown in FIG. 5E). In some embodiments, the bonding material 31A is formed on top surfaces, sidewalls of the patterned photoresist 820. The bonding material 31A may be formed by PVD.

Figure 5F:
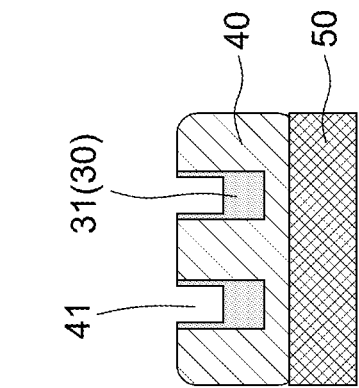

Referring to FIGS. 2D and 5F, the patterned photoresist 820 may be removed. In some embodiments, portions of the bonding material 31A on the patterned photoresist 820 are removed along with the removal of the patterned photoresist 820, so as to form a bonding element 30 (e.g., the portion 31 of the bonding element 30) in the trenches 41 of the barrier 40.

Referring to FIGS. 1 and 2D, the carrier 10 may be bonded to the surface 601 of the substrate 60 through the bonding element 30. In some embodiments, the carrier 10 is bonded to the surface 601 of the substrate 60 through the bonding element 30, for example, by applying a soldering material and heating the soldering material to form solder joint (the bonding element 30) between the carrier 10 and the substrate 60. For example, the soldering material of the bonding element 30 may be heated by a laser beam and melted during heating. In some embodiments, referring to FIGS. 1 and 2E-2F, the soldering material of the bonding element 30 may further form a molten bonding portion (e.g., the portion 31) flown into the trenches 41 of the barrier 40. In some embodiments, the molten bonding portion (e.g., the portion 31) may react with the bonding material 31A in the trenches and turns into an intermetallic material. After bonding the carrier 10 to the surface 601 of the substrate 60 through the bonding element 30 is completed, the electronic package 1 is formed.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic package, comprising:
a carrier having a conductive layer;
a first electronic component disposed adjacent to the carrier and having a first terminal and a second terminal;
a bonding element configured to electrically connect the conductive layer to the first terminal; and
a barrier configured to avoid electrically bypassing an electrical path in the first electronic component and between the first terminal and the second terminal, wherein the barrier comprises a receiving space configured to accommodate at least a portion of the bonding element.

2. The electronic package as claimed in claim 1, wherein the electrical path is configured to drive the first electronic component.

3. The electronic package as claimed in claim 1, wherein the first terminal is more adjacent to the conductive layer than the second terminal is.

4. The electronic package as claimed in claim 1, wherein the barrier is configured to block a passage and wherein the passage comprises a gap between the first electronic component and the carrier.

5. The electronic package as claimed in claim 1, wherein the first electronic component comprises a light-emitting element and the carrier comprises a photonic component.

6. The electronic package as claimed in claim 1, wherein the first electronic component is spaced apart from the bonding element.

7. The electronic package as claimed in claim 1, further comprising a substrate electrically connecting the first electronic component to the carrier at least via the bonding element.

8. The electronic package as claimed in claim 1, wherein the receiving space comprises one or more trenches.

9. The electronic package as claimed in claim 8, wherein the bonding element comprises a first portion within at least one of the one or more trenches.

10. The electronic package as claimed in claim 9, wherein the bonding element comprises a second portion outside of the one or more trenches, and a hardness of the first portion is different from a hardness of the second portion.

11. The electronic package as claimed in claim 8, wherein at least one of the one or more trenches comprises a predetermined pattern for alignment, and the bonding element at least partially fills in the predetermined pattern of the one or more trenches.

12. An electronic package, comprising:
a first electronic component;
a carrier comprising a conductive layer and defining a cavity accommodating the first electronic component, wherein the carrier and the first electronic component collectively define a gap;
an electrical bonding element electrically connected to the conductive layer; and
a barrier configured to block a passage by which the electrical bonding element contacts a surface of the first electronic component or enters the gap, wherein the barrier surrounds the electrical bonding element.

13. The electronic package as claimed in claim 12, wherein the cavity of the carrier is spaced apart from the electrical bonding element.

14. The electronic package as claimed in claim 12, further comprising:
a dielectric layer between the carrier and the barrier.

* * * * *